(12) United States Patent
Schlueter et al.

(10) Patent No.: US 7,535,229 B2
(45) Date of Patent: May 19, 2009

(54) NMR SYSTEM AND METHOD HAVING A PERMANENT MAGNET PROVIDING A ROTATING MAGNETIC FIELD

(76) Inventors: Ross D. Schlueter, 780 Cragmont Ave., Berkeley, CA (US) 94708; Thomas F. Budinger, 966 Euclid Ave., Berkeley, CA (US) 94708

( * ) Notice: Subject to any disclaimer, the term of this patent is extended or adjusted under 35 U.S.C. 154(b) by 0 days.

(21) Appl. No.: 11/740,772

(22) Filed: Apr. 26, 2007

(65) Prior Publication Data

US 2008/0024130 A1 Jan. 31, 2008

Related U.S. Application Data

(63) Continuation of application No. PCT/US2005/038536, filed on Oct. 26, 2005.

(60) Provisional application No. 60/622,714, filed on Oct. 26, 2004.

(51) Int. Cl.
*G01V 3/00* (2006.01)
(52) U.S. Cl. ............... 324/318; 324/307; 324/309; 324/310; 324/319; 324/321
(58) Field of Classification Search ......... 324/300–322; 600/415, 410, 422; 335/296–306
See application file for complete search history.

(56) References Cited

U.S. PATENT DOCUMENTS

| 3,462,677 | A | * | 8/1969 | Paitich | 324/321 |
| 5,260,657 | A | | 11/1993 | Lewis et al. | |
| 6,535,092 | B1 | * | 3/2003 | Hurley et al. | 335/306 |
| 6,989,674 | B2 | | 1/2006 | Wind et al. | |
| 2003/0210046 | A1 | | 11/2003 | Wind et al. | |
| 2005/0027190 | A1 | * | 2/2005 | Chiodo | 600/415 |
| 2008/0024130 | A1 | * | 1/2008 | Schlueter et al. | 324/309 |

OTHER PUBLICATIONS

Jachmann, et al., "Multipole shimming of permanent magnets using harmonic corrector rings," *Review of Scientific Instruments*, 78, 035115 (2007).
International Search Report and Written Opinion from International Application No. PCT/US05/38536 mailed Aug. 28, 2006.

* cited by examiner

*Primary Examiner*—Brij B. Shrivastav
*Assistant Examiner*—Tiffany A Fetzner
(74) *Attorney, Agent, or Firm*—Knobbe, Martens, Olson & Bear LLP

(57) ABSTRACT

Disclosed herein are systems and methods for generating a rotating magnetic field. The rotating magnetic field can be used to obtain rotating-field NMR spectra, such as magic angle spinning spectra, without having to physically rotate the sample. This result allows magic angle spinning NMR to be conducted on biological samples such as live animals, including humans.

31 Claims, 5 Drawing Sheets

NMR SYSTEM AND METHOD HAVING A PERMANENT MAGNET PROVIDING A ROTATING MAGNETIC FIELD

CROSS-REFERENCE TO RELATED APPLICATIONS

This application is a continuation of PCT International Application No. PCT/US2005/038536, filed Oct. 26, 2005, which claims the benefit of U.S. Provisional Application No. 60/622,714, filed Oct. 26, 2004, both of which are incorporated herein by reference in their entirety.

STATEMENT REGARDING FEDERALLY SPONSORED R&D

This invention was made with Government support under Contract No DE-AC03-76SF00098 awarded by the Department of Energy. The Government has certain rights in this invention.

BACKGROUND OF THE INVENTION

1. Field of the Invention

The invention relates to systems and methods for generating rotating magnetic fields. In some embodiments, the rotating magnetic fields may be used to acquire NMR spectra.

2. Description of the Related Art

Dipole coupling and chemical shift anisotropy in systems containing molecules that are unable to tumble freely and rapidly (e.g., solid state systems or biological systems containing large biomolecules or cellular or tissue material) results in magnetic field anisotropy that obscures the nuclear magnetic resonance (NMR) spectra of such systems due to line broadening. These line broadening effects can be minimized by spinning the sample about an axis that is at the angle with respect to the Z magnetic field axis in an NMR spectrometer that causes the Z component of the magnetic field due to dipole coupling and chemical shift anisotropy to be zero. This angle is 54.7°, the so called "magic angle," due to the presence of a 1-3 $\cos^2 \theta$ term in the dipole coupling and chemical shift anisotropy magnetic field equations. Magic angle spinning (MAS) NMR spectroscopy has been used with success for obtaining spectra of solid state samples. However, spinning of biological samples is not feasible. Spinning of ex vivo tissue at the typical 4 to 5 kHz MAS rates can result in damage and component separation due to centrifugal forces during spectrum acquisition. Furthermore, spinning of live animals can be deadly to the animal. Accordingly, there is a need for systems and methods that provide magnetic field rotation through a sample without having to rotate the sample itself.

SUMMARY OF THE INVENTION

One embodiment disclosed herein includes an apparatus for generating a rotating magnetic field for use in acquiring a NMR spectrum that includes a first magnetic field generating device adapted to generate a rotating magnetic field and a second magnetic field generating device adapted to generate a non-rotating magnetic field at a non-zero angle relative to the rotating magnetic field.

Another embodiment disclosed herein includes an apparatus for generating a rotating magnetic field for use in acquiring a NMR spectrum that includes a solenoid adapted to generate a substantially uniform magnetic field within a volume contained inside the solenoid's bore, an annular permanent magnet disposed within the solenoid's bore, wherein the permanent magnet is adapted to generate a substantially uniform magnetic field within a volume contained inside the permanent magnets' bore, wherein the volume contained inside the solenoid's bore substantially overlaps with the volume contained inside the permanent magnets' bore, and a motor operatively coupled to the permanent magnet and adapted to rotate the annular permanent magnet within the solenoid.

Another embodiment disclosed herein includes an apparatus for measuring a rotating magnetic field NMR spectrum of a sample that includes a first magnetic field generating device adapted to generate a rotating magnetic field having a substantially time-invariant strength within a sample volume, a second magnetic field generating device adapted to generate an adjustable non-rotating magnetic field at a non-zero angle relative to the rotating magnetic field within the sample volume, and an NMR probe adapted to measure an NMR spectrum of a sample contained within the sample volume.

Another embodiment disclosed herein includes a method of obtaining a magic angle spinning NMR spectrum of a sample that includes generating a rotating magnetic field within the sample, generating a non-rotating magnetic field within the sample at a non-zero angle with respect to the rotating magnetic field, adjusting the strength of the non-rotating magnetic field such that superposition of the rotating and non-rotating magnetic fields produces a magnetic field rotating about an axis at an angle of about 54.7° with respect to the axis, obtaining an NMR spectrum of the sample.

DETAILED DESCRIPTION OF CERTAIN EMBODIMENTS

One embodiment is a system for providing a rotating magnetic field using multiple magnetic field generating devices. The magnetic fields generated by each magnetic field generating device can be such that superposition of the magnetic fields from all of the magnetic field generating devices produce the desired rotating magnetic field. In one such embodiment, two magnetic field generating devices are used. One of the devices is adapted to generate a rotating magnetic field and the second device generates a non-rotating magnetic field. In one embodiment, the two devices can be aligned in such a manner that the fields combine. In one embodiment, the devices are aligned such that the non-rotating magnetic field is at a substantially constant non-zero angle with respect to the rotating magnetic field. By "substantially constant non-zero angle" it is meant that the axis of rotation of the rotating magnetic field is substantially parallel with the non-rotating magnetic field. By "substantially parallel" it is meant parallel to within 500 millionths of a radian, preferably within 100, more preferably 50 and even more preferably within 20 millionths of a radian.

Figure 1A:
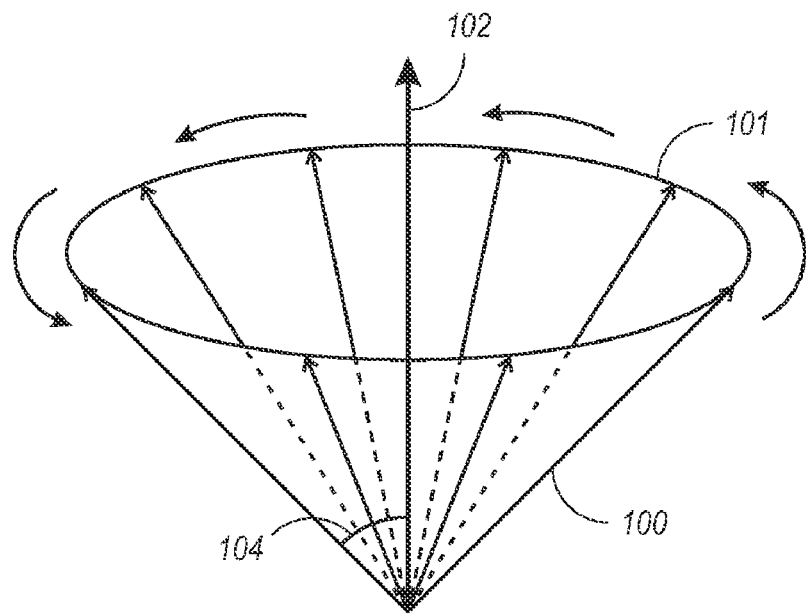
FIG. 1A is a vector diagram of rotating and non-rotating magnetic fields.

FIG. 1A depicts a vector diagram of the magnetic fields generated by such an aligned device. The first magnetic field generating device generates a magnetic field 100. The magnetic field 100 rotates about a central axis through a cone 101. The second magnetic field generating device generates a magnetic field 102. The non-rotating magnetic field 102 may be aligned with the central axis of the rotating magnetic field 100 such that a constant non-zero angle 104 is made between the non-rotating magnetic field 102 and the rotating magnetic field 100. In one embodiment, the non-zero angle 104 is about 90° such that the rotating 100 and non-rotating 102 fields are substantially perpendicular. By "substantially perpendicular," it is meant perpendicular to within 500 millionths of a radian, preferably within 100, more preferably 50 and even more preferably within 20 millionths of a radian. In such an embodiment, the rotating magnetic field 100 rotates in a plane making the cone 101 a substantially planar circle.

Figure 1B:
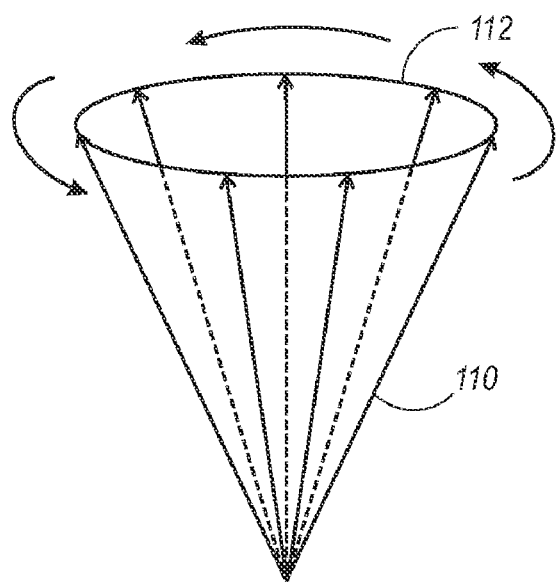
FIG. 1B is a vector diagram of the rotating magnetic field resulting from the superposition of the fields depicted in FIG. 1A.

The resulting magnetic field generated by the superposition of the rotating 100 and non-rotating 102 fields is depicted in FIG. 1B. The result is a magnetic field 110 rotating through a cone 112. The cone 112 will have a narrower angle than the cone 101 due to the addition of the non-rotating magnetic field 102 to the rotating magnetic field 100. The angle that the resultant rotating magnetic field 110 makes with respect to its central axis will depend on the angle 104 of the initial cone 101 and the relative strengths of the rotating 100 and non-rotating 102 magnetic fields. In some embodiments, the strength of the non-rotating 102 and/or rotating 100 magnetic fields are adjustable such that resultant angle that the rotating magnetic field 110 makes with respect to its axis is adjustable. In one embodiment, the magnetic fields are adjusted such that the resultant angle is the "magic angle" of about 54.7°.

The magnetic field generating devices may be any suitable device for generating magnetic fields including one or more permanent magnets or electromagnets. Suitable permanent magnets may include multiple magnet segments so that the resulting field has a desired shape and uniformity. Electromagnets may be constructed using any suitable coil design. In one embodiment, a solenoid is utilized.

Magnetic field generating devices may be adapted to produce rotating magnetic fields by mechanically rotating a magnetic field generating device that produces a constant magnetic field. For example, a permanent or electromagnetic producing a constant magnetic field may be rotated by a motor to produce a rotating magnetic field. In various embodiments, the magnetic field generating device is rotated at a rate of at least about 1 Hz, 10 Hz, 50 Hz, 100 Hz, 500 Hz, or 1000 Hz. Alternatively, multiple stationary electromagnets may be driven by an appropriate driving scheme such that the superposition of the fields produced by the electromagnets is a rotating magnetic field. For example, three orthogonal Helmholtz coils may be dynamically driven such that a rotating magnetic field is produced such as described in Meriles et al., "High-resolution NMR of static samples by rotation of the magnetic field," *J. Magnetic Resonance,* 169 (2004), 13-18, which is incorporated herein by reference in its entirety.

In one embodiment, magnetic field generating devices are used that generate substantially uniform magnetic fields within a desired volume. By "uniform," it is meant that the magnetic fields are spatially constant to within approximately 500 ppm over the desired volume. In some embodiments, magnetic fields having 100 ppm, 50 ppm, or 20 ppm uniformity are used. When a magnetic field generating device is adapted to produce a rotating magnetic field, substantial uniformity refers to the uniformity of the magnetic field produced by the device prior to rotation (e.g., prior to mechanically rotating a magnet).

In one embodiment, magnetic field generating devices are used that generate substantially time-invariant magnetic fields. By "substantially time-invariant magnetic fields," it is meant that the magnetic field strengths are substantially constant over a relevant data collection time to within approximately 500 ppm, preferably 100 ppm, more preferably 50 ppm, and even more preferably 20 ppm.

In some embodiments, the magnetic field generating devices are positioned such that the resulting rotating magnetic field is produced in a sample volume in which an NMR spectrum may be detected with a suitable NMR probe. Those of skill in the art will recognize NMR probes and systems suitable for obtaining NMR spectra of samples within the sample volume. In one such embodiment, the magnetic field generating devices produce substantially uniform and time-invariant magnetic fields within the sample volume.

Figure 2:
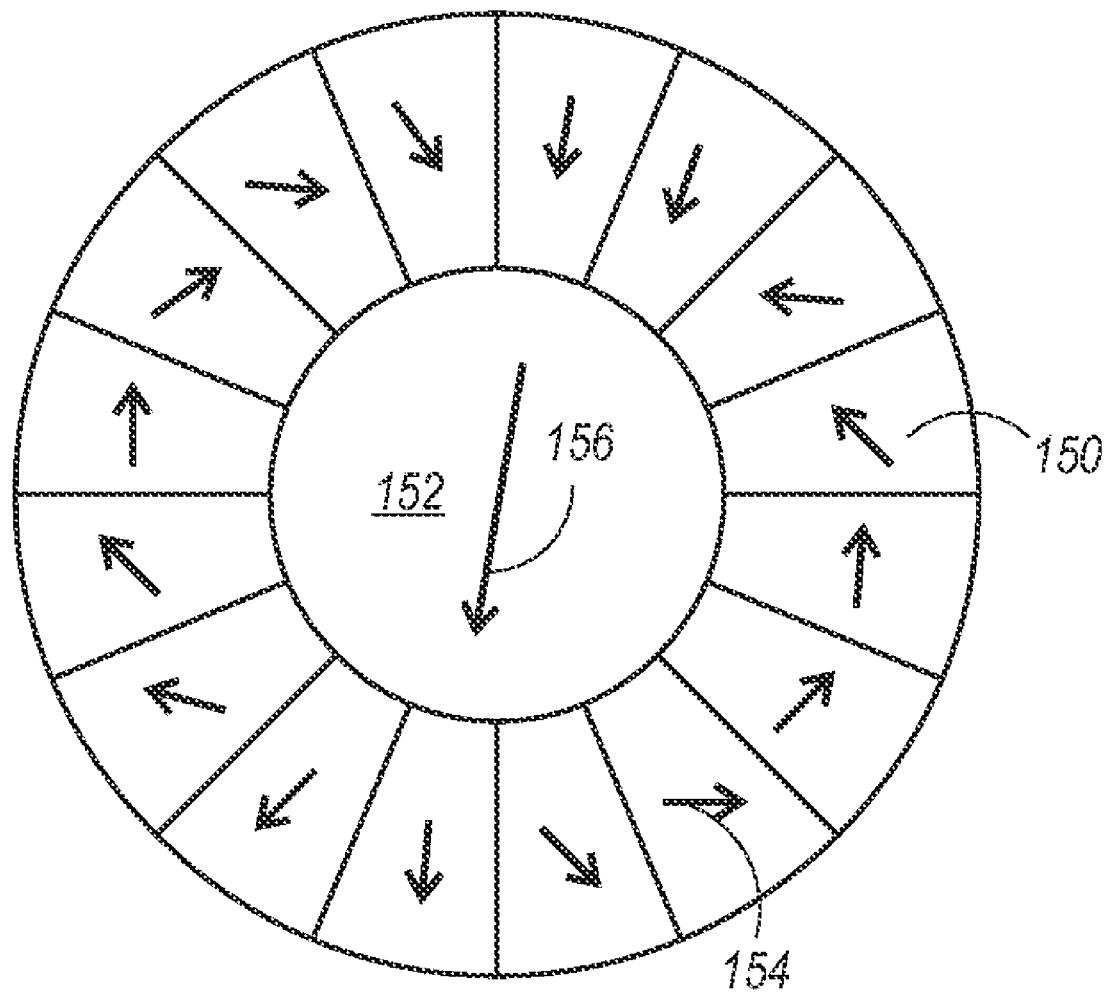
FIG. 2 is a cross-section of a segmented permanent magnet.

In one embodiment, the magnetic field generating device that produces the rotating magnetic field includes a plurality of permanent magnet segments in an annular arrangement. FIG. 2 depicts a cross-section of one such annular permanent magnet arrangement consisting of 16 wedge shaped segments 150 defining a hollow bore 152. The dipole directions 154 of each permanent magnet segment 150 may be selected to produce the desired magnetic field shape within the bore 152. For example, the dipoles depicted in FIG. 2 generate a substantially uniform lateral magnetic field 156 within the bore 152. The uniformity of the resultant magnetic field is enhanced by using multiple magnet segments 150 with fine-tuned dipole directions. The orientations of each dipole may be such that the magnetic field generated by each segment 150 within the bore 152 is substantially in a single direction, thus producing a uniform lateral magnetic field over a significant volume within the bore 156. This type of segmented annular magnet is described in more detail in Halbach, K., "Design of Permanent Multipole Magnets with Oriented Rare Earth Cobalt Material," *Nuclear Instruments and Methods,* 169 (1980) 1-10, which is incorporated herein by reference in its entirety. Multiple segments can also be used in the longitudinal direction of the annular magnet. For example, stacks of arrangements depicted in FIG. 2 may be used in order to provide magnetic field uniformity along the length of the annular magnet.

If a permanent magnet such as described above is mechanically rotated about the bore's axis, the lateral magnetic field 156 will rotate with the magnet. In one embodiment, the uniformity of the resultant magnetic field is enhanced by inserting a magnet yoke sleeve inside the bore 152. In one embodiment, the uniformity of the magnetic fields and field gradients produced by the permanent magnet may be adjusted and tuned by adjusting the position and orientation of one or more permanent magnet segments 150. Accordingly, in some embodiments, features are incorporated within the permanent magnet assembly that allows for adjustability of one or more permanent magnet segments 150. For example, the permanent magnet segments 150 may be held in place by adjustment screws that allow their orientation to be selectively adjusted.

Those of skill in the art will appreciate that by appropriately selecting the magnet segments and dipole directions, a resultant magnetic field may be generated at any angle relative to the central axis of the bore. In one embodiment, a transverse magnetic field is generated that is substantially perpendicular to the central axis of the bore. In one embodiment, the magnet segments consist of NdFeB magnets, however, any suitable magnetic material may be used. In one embodiment, each segment is sized so that the entire assembly has a diameter of 8 cm with a 5 cm diameter bore, however, any suitable dimensions may be used. The size of the bore desired may be determined by the size of samples expected to be inserted into the bore. In one embodiment, four stacks of segments are used and the magnet has an overall length of 10 cm, however, any suitable number of stacks may be used. In one embodiment, the field strength of the substantially lateral magnetic field 156 is approximately 0.5 T.

Figure 3:
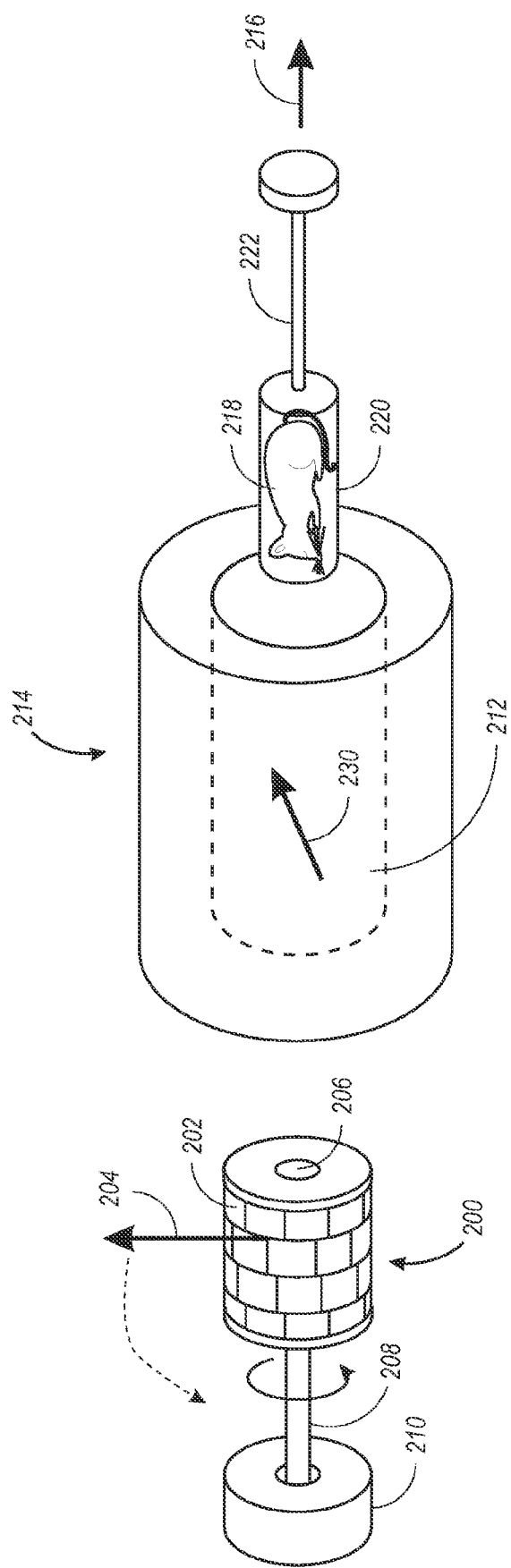
FIG. 3 is an exploded view of permanent magnet and solenoid system for generating rotating magnetic fields.

FIG. 3 depicts an exploded view of a system utilizing a permanent magnet such as depicted in FIG. 2. The permanent magnet 200 consists of four stacks of permanent magnet segments 202 arranged in the annular arrangement depicted in FIG. 2. A transverse magnetic field 204 is generated within the bore 206 of the magnet 200. The magnet 200 is coupled via a shaft 208 to a motor 210. The motor 210 may be used to rotate the magnet 200 and thus the magnetic field 204 in the bore 206. The magnet 200 may be inserted into the bore 212 of a solenoid 214. The solenoid 214 may comprise wire coils configured to generate a magnetic field 216 substantially parallel to the axis of the bores 206 and 212. In some embodiments, the solenoid 214 is adapted to generate a substantially uniform magnetic field along the axis of bore 212. In some embodiments, the solenoid 214 is also adapted to provide a substantially time-invariant magnetic field. This time-invariance can be accomplished by providing a stable power supply to supply stable current to the solenoid 214.

The superposition of the rotating transverse magnetic field 204 and the stationary axial magnetic field 216 generates a rotating magnetic field within the bore 206 having an angle between 0° and 90° with respect to the central axis. The angle of the rotating magnetic field depends on the relative strengths of the fields 204 and 216. In one embodiment, the current driven through the solenoid 214 may be adjusted to produce a variable axial magnetic field strength 216, thus allowing the angle of the rotating magnetic field to be tuned to the desired angle. For example, the angle may be tuned to the "magic angle" 54.7° for the purposes of magic angle spinning NMR. In one embodiment, the strength of the magnetic field generated by the solenoid is between 0.1 and 1.0 T. A sample (e.g., an animal 218) may be inserted into a sample container 220 for insertion into the bore 206 of the permanent magnet 200. The sample container 220 may be coupled to a rod 222 to allow for insertion and removal of the sample container into the bore 206. For NMR spectroscopy applications, a suitable probe coil may be included such that it surrounds the sample container 220.

In some embodiments, the axis of rotation of the rotating transverse magnetic field 204 is aligned to be substantially parallel to the stationary axial magnetic field 216. This alignment may be accomplished by using permanent magnet tuner shims that rotate in synchronization with the rotating magnet 200. These tuner shims may be adjusted to provide a desired magnetic field or field gradient correction. Alternatively, more traditional electromagnetic trim coils may be used to correct the field or field gradient in the resulting rotating magnetic field.

Figure 4:
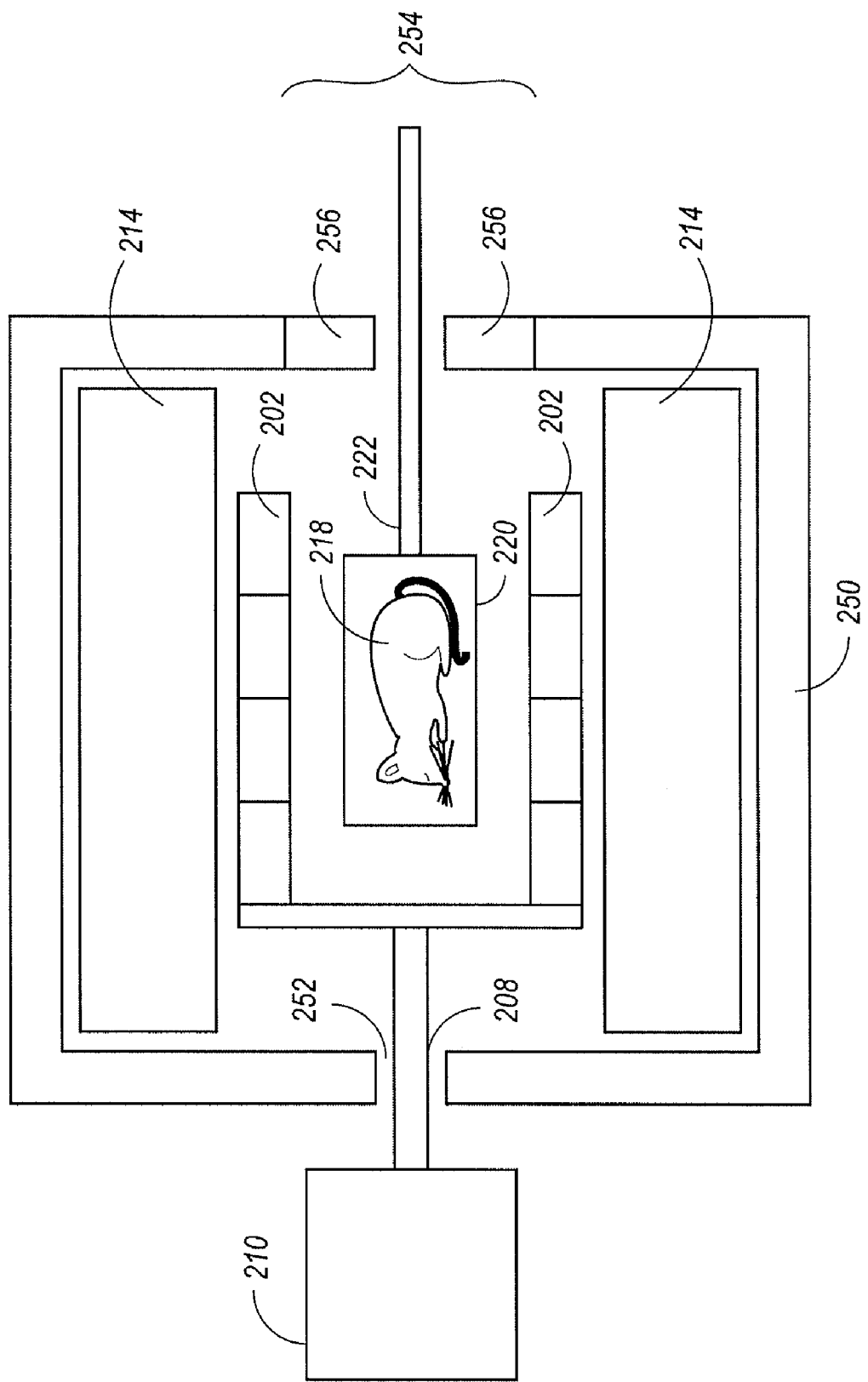
FIG. 4 is a cross-section of the system of FIG. 3.

FIG. 4 depicts a cross-sectional view of the assembled apparatus depicted in FIG. 3. The permanent magnet segments 202 and the solenoid 214 may be contained within an iron yoke 250 to increase the flux of the magnetic fields. An aperture 252 may be made in the yoke 250 so that the shaft 208 can extend to the motor 210. A larger aperture 254 may be provided for introducing the sample container 220. Removable plugs 256 may be provided to cover a significant part of the aperture 254 after insertion of the sample container 220. For NMR spectroscopy applications, a suitable NMR probe may also be included. In some embodiments, the size of the apparatus and the sample holder 220 are adapted to hold an animal such as a mouse 218 as depicted in FIG. 4 or a human. Such a system can be used to analyze NMR spectra of cells, living tissues, and organs. For example, NMR spectra of membrane phospholipids in in vivo brain tissue could be analyzed to determine if neurodegeneration is present. In other embodiments, the sample holder 220 is adapted to hold ex vivo biological samples such as cellular or tissue matter. Accordingly, the apparatus depicted in FIG. 4 can be used to obtain magic angle spinning NMR spectra of samples that cannot themselves be spun.

Figure 5:
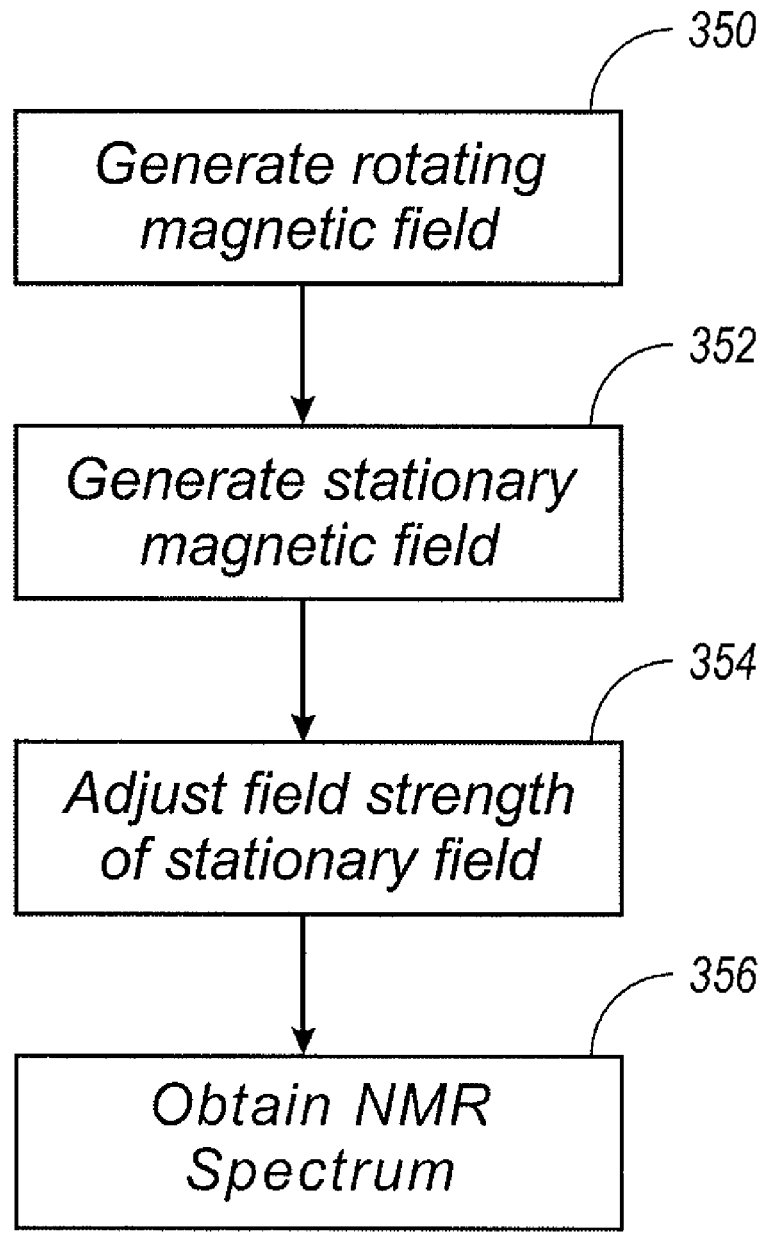
FIG. 5 is a flow chart illustrating a method for adjusting the angle of a rotating magnetic field.

In some embodiments, a method is provided for tuning an apparatus, such as described above, to obtain a rotating magnetic field rotating at a desired angle. The resulting field may then be used to obtain a rotating magnetic field NMR spectrum. Such a method is depicted in the flow chart of FIG. 5. First, at block 350, a rotating magnetic field is generated. Next at block 352 a non-rotating magnetic field is generated such that the superposition of the non-rotating magnetic field and the rotating magnetic field produces a rotating magnetic field. Then at block 354 the strength of the non-rotating magnetic field is adjusted until the resulting rotating magnetic field is rotating at a desired angle. In one embodiment, the strength of the non-rotating magnetic field is adjusted to produce a rotating magnetic field at an angle of about 54.7°. In other embodiments, other angles are chosen. Finally, at block 356, an NMR spectrum of a sample within the rotating magnetic field is obtained.

Although the invention has been described with reference to embodiments and examples, it should be understood that numerous and various modifications can be made without departing from the spirit of the invention. Accordingly, the invention is limited only by the following claims.

What is claimed is:

1. An apparatus measuring a rotating magnetic field NMR spectrum of a sample comprising:
    a rotatable permanent magnet that generates a rotating magnetic field;
    a second magnetic field generating device that generates a non-rotating magnetic field at a non-zero angle relative to the rotating magnetic field; and
    an NMR probe that measures a rotating magnetic field NMR spectrum of a sample contained within the sample volume.

2. The apparatus of claim 1, wherein the rotatable permanent magnet comprises a plurality of permanent magnet segments.

3. The apparatus of claim 1, wherein the second magnetic field generating device is an electromagnet.

4. The apparatus of claim 1, wherein the second magnetic field generating device is a solenoid.

5. The apparatus of claim 1, wherein the rotating magnetic field is substantially orthogonal to the non-rotating magnetic field.

6. The apparatus of claim 1, wherein the second magnetic field generating device generates the non-rotating magnetic field at variable strength.

7. The apparatus of claim 1, wherein the rotating and non-rotating magnetic fields are substantially uniform within a same volume.

8. An apparatus generating a rotating magnetic field configured for use in acquiring a NMR spectrum, comprising:
    a solenoid that generates a substantially uniform magnetic field within a volume contained inside the solenoid's bore;
    an annular permanent magnet disposed within the solenoid's bore, wherein the permanent magnet generates a substantially uniform magnetic field within a volume contained inside the permanent magnets' bore, wherein the volume contained inside the solenoid's bore substantially overlaps with the volume contained inside the permanent magnets' bore; and a motor operatively coupled to the permanent magnet, wherein the motor rotates the annular permanent magnet within the solenoid.

9. The apparatus of claim 8, wherein the annular permanent magnet comprises a plurality of magnetic segments.

10. The apparatus of claim 9, further comprising one or more magnetic segment adjusters allowing adjustment of the position of one or more of the plurality of magnetic segments.

11. The apparatus of claim 8, wherein the axis of the solenoid's bore is substantially parallel to the axis of the permanent magnet's bore.

12. The apparatus of claim 8, wherein the permanent magnet generates a magnetic field that is substantially perpendicular to a magnetic field generated by the solenoid.

13. The apparatus of claim 8, further comprising one or more tuner shim(s) coupled to the permanent magnet, wherein the tuner shim(s) adjust the angle of the axis of rotation of the permanent magnet relative to the axis of the solenoid's bore.

14. The apparatus of claim 13, wherein the tuner shim(s) rotate in synchronization with rotation of the permanent magnet.

15. An apparatus for measuring a rotating magnetic field NMR spectrum of a sample, comprising:
a rotatable permanent magnet that generates a rotating magnetic field having a substantially time-invariant strength within a sample volume;
a second magnetic field generating device that generates an adjustable non-rotating magnetic field at a non-zero angle relative to the rotating magnetic field within the sample volume; and
an NMR probe that measures a rotating magnetic field NMR spectrum of a sample contained within the sample volume.

16. The apparatus of claim 15, wherein the rotatable permanent magnet comprises a plurality of permanent magnet segments.

17. The apparatus of claim 15, wherein the second magnetic field generating device is an electromagnet.

18. The apparatus of claim 15, wherein the second magnetic field generating device is a solenoid.

19. The apparatus of claim 15, wherein the rotating magnetic field is substantially orthogonal to the non-rotating magnetic field.

20. The apparatus of claim 15, wherein superposition of the rotating and non-rotating magnetic fields produces a magnetic field rotating about an axis at an angle of about 54.7° with respect to the axis.

21. The apparatus of claim 15, wherein the apparatus produces a magic angle spinning NMR spectrum of a sample without rotation of the sample.

22. The apparatus of claim 15, further comprising a specimen holder.

23. The apparatus of claim 22, wherein the specimen is an animal.

24. The apparatus of claim 22, wherein the specimen is a human.

25. The apparatus of claim 15, wherein the second magnetic field generating device generates a non-rotating magnetic field that is substantially time-invariant during NMR spectrum acquisition.

26. The apparatus of claim 15, wherein the rotatable permanent magnet and the second magnetic field generating devices generate magnetic fields that are substantially uniform within the sample volume.

27. A method of obtaining a magic angle spinning NMR spectrum of a sample, comprising:
generating a rotating magnetic field within the sample by mechanically rotating a permanent magnet that produces a constant magnetic field;
generating a non-rotating magnetic field within the sample at a non-zero angle with respect to the rotating magnetic field;
adjusting the strength of the non-rotating magnetic field such that superposition of the rotating and non-rotating magnetic fields produces a magnetic field rotating about an axis at an angle of about 54.7° with respect to the axis; and
obtaining a magic angle spinning NMR spectrum of the sample.

28. The method of claim 27, wherein the rotating magnetic field is generated substantially perpendicular to the non-magnetic field.

29. The method of claim 27, wherein the permanent magnet comprises a plurality of permanent magnet segments.

30. The method of claim 27, wherein generating the non-rotating magnetic field comprises passing a current through a solenoid.

31. The method of claim 30, wherein adjusting the strength of the non-rotating magnetic field comprises adjusting the current through the solenoid.

* * * * *